United States Patent
Fitzgerald et al.

(10) Patent No.: US 12,479,412 B1
(45) Date of Patent: Nov. 25, 2025

(54) PORTABLE ELECTRONIC BRAKE TOOL AND METHOD THEREFOR

(71) Applicants: Blake Richard Fitzgerald, Mission Viejo, CA (US); Daniel Gerard Fitzgerald, Laguna Hills, CA (US); Jose de Jesus Mundo-Alvarez, Mission Viejo, CA (US)

(72) Inventors: Blake Richard Fitzgerald, Mission Viejo, CA (US); Daniel Gerard Fitzgerald, Laguna Hills, CA (US); Jose de Jesus Mundo-Alvarez, Mission Viejo, CA (US)

( * ) Notice: Subject to any disclaimer, the term of this patent is extended or adjusted under 35 U.S.C. 154(b) by 0 days.

(21) Appl. No.: 18/789,133

(22) Filed: Jul. 30, 2024

(51) Int. Cl.
*B60T 17/22* (2006.01)
*F16D 65/00* (2006.01)
*H05K 5/00* (2025.01)
*H05K 5/02* (2006.01)

(52) U.S. Cl.
CPC ........ *B60T 17/221* (2013.01); *F16D 65/0043* (2013.01); *H05K 5/0086* (2013.01); *H05K 5/0247* (2013.01)

(58) Field of Classification Search
CPC ................. B60T 17/221; B25B 27/0035
See application file for complete search history.

(56) References Cited

U.S. PATENT DOCUMENTS

| | | | |
|---|---|---|---|
| 5,269,053 A | 12/1993 | Hicks | |
| 6,378,185 B1 | 4/2002 | Ratchovsky | |
| 6,925,368 B2 * | 8/2005 | Funkhouser | G07C 5/0808 340/439 |
| 7,076,850 B2 | 7/2006 | Ploeger | |
| 7,512,413 B2 * | 3/2009 | Hui | H01Q 21/30 343/702 |
| 9,403,521 B2 * | 8/2016 | Williams | F16D 65/28 |
| 9,767,626 B2 * | 9/2017 | Makke | B60T 17/222 |
| 11,097,710 B2 * | 8/2021 | Anderson | B60T 17/004 |
| 11,513,509 B2 * | 11/2022 | Diamond | H04W 76/10 |
| 12,079,616 B2 * | 9/2024 | Cain, Jr. | G06F 8/61 |
| 2013/0256071 A1 * | 10/2013 | Jones | B60T 8/34 188/352 |
| 2014/0139332 A1 * | 5/2014 | Mouchet | B60C 23/0479 340/442 |
| 2020/0355231 A1 | 11/2020 | Chen | |
| 2021/0114190 A1 | 4/2021 | Bretz | |
| 2022/0243778 A1 * | 8/2022 | Heeder | F16D 66/027 |

* cited by examiner

Primary Examiner — Jason L Vaughan

(57) ABSTRACT

A portable electronic brake tool includes a housing, a rechargeable battery removably inserted into the housing, a reverse polarity switch positioned at an exterior surface of the housing, a connector assembly that includes a wiring interface mounted in the housing and a wiring harness designed to detachably connect to an electric receptacle of an electronic brake caliper, and an electrical wiring assembly positioned in the housing and operatively connecting the rechargeable battery, the reverse polarity switch, and the wiring interface.

14 Claims, 7 Drawing Sheets

PORTABLE ELECTRONIC BRAKE TOOL AND METHOD THEREFOR

CROSS-REFERENCE TO RELATED APPLICATIONS

I hereby claim the benefit under 35 U.S.C. Section 119(e) of U.S. Provisional application 63/620,669, filed Jan. 12, 2024, which is incorporated by reference herein.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to vehicle brake servicing tools and more particularly pertains to a new portable electronic brake tool for allowing a user to selectively extend and retract a piston of an electronic brake of a vehicle, such as an automobile, without the use of the vehicle battery or a diagnostic tool that interfaces with the On-Board Diagnostic II (OBD II) system of the vehicle.

As is known in the automotive industry, an electronic brake has its own individual electric drive motor to move the piston back and forth. This design can cause a problem for non-professionals and even technicians servicing the brakes, such as when the technician wishes to install new brake pads into the caliper, because the electric drive motor holds the piston in place. Consequently, the use of traditional methods of moving the piston and opening the caliper, such as using a handheld brake caliper tool or a screwdriver to move or compress the piston back into the caliper, are ineffective due to the electric drive motor holding the piston in place. In addition, technicians and non-professionals unfamiliar with repairing electronic brakes can damage the caliper and create leaks by using these traditional methods to force the piston back into the caliper. If the electronic motor does not retract the caliper piston properly, the caliper will be damaged and must be replaced.

The most common way technicians perform these brake jobs is by using an expensive scan tool that is connected into the vehicle OBD II system located inside of the vehicle. The main problem with using this OBD II tool is that the OBD II connection port is located inside the vehicle, typically under the dashboard. The technician can command the brake caliper piston to open or shut with the scan tool, but unfortunately the technician is seated in the front of the vehicle and nowhere near the brake being serviced. Consequently, the technician must leave the vehicle to go check the status of the brakes, which might need to be done several times and thereby waste time. For non-professionals, a scan tool is a considerable expense, so most do not have one and thus cannot safely work on brakes that have an electronic brake component. In addition, the scan tool is useless if the vehicle has no power due to a dead battery or having no battery at all, as the electronic brake cannot be operated in those situations.

(2) Description of Related Art Including Information Disclosed Under 37 CFR 1.97 and 1.98

The prior art relates to vehicle brake servicing tools. The prior art, as best understood, does not disclose a portable electronic brake tool that has its own power source and wiring harness designed to detachably connect to an electric receptacle of an electronic brake caliper to allow a user to operate the electronic brake caliper at the brake assembly itself.

BRIEF SUMMARY OF THE INVENTION

An embodiment of the disclosure meets the needs presented above in a portable electronic brake tool generally comprising a housing, a rechargeable battery, a reverse polarity switch, a connector assembly, and an electrical wiring assembly. The rechargeable battery is removably inserted into the housing. The reverse polarity switch is positioned at an exterior surface of the housing. The connector assembly includes a wiring interface mounted in the housing and a wiring harness designed to detachably connect to an electric receptacle of an electronic brake caliper. The electrical wiring assembly is positioned in the housing and operatively connects the rechargeable battery, the reverse polarity switch, and the wiring interface.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
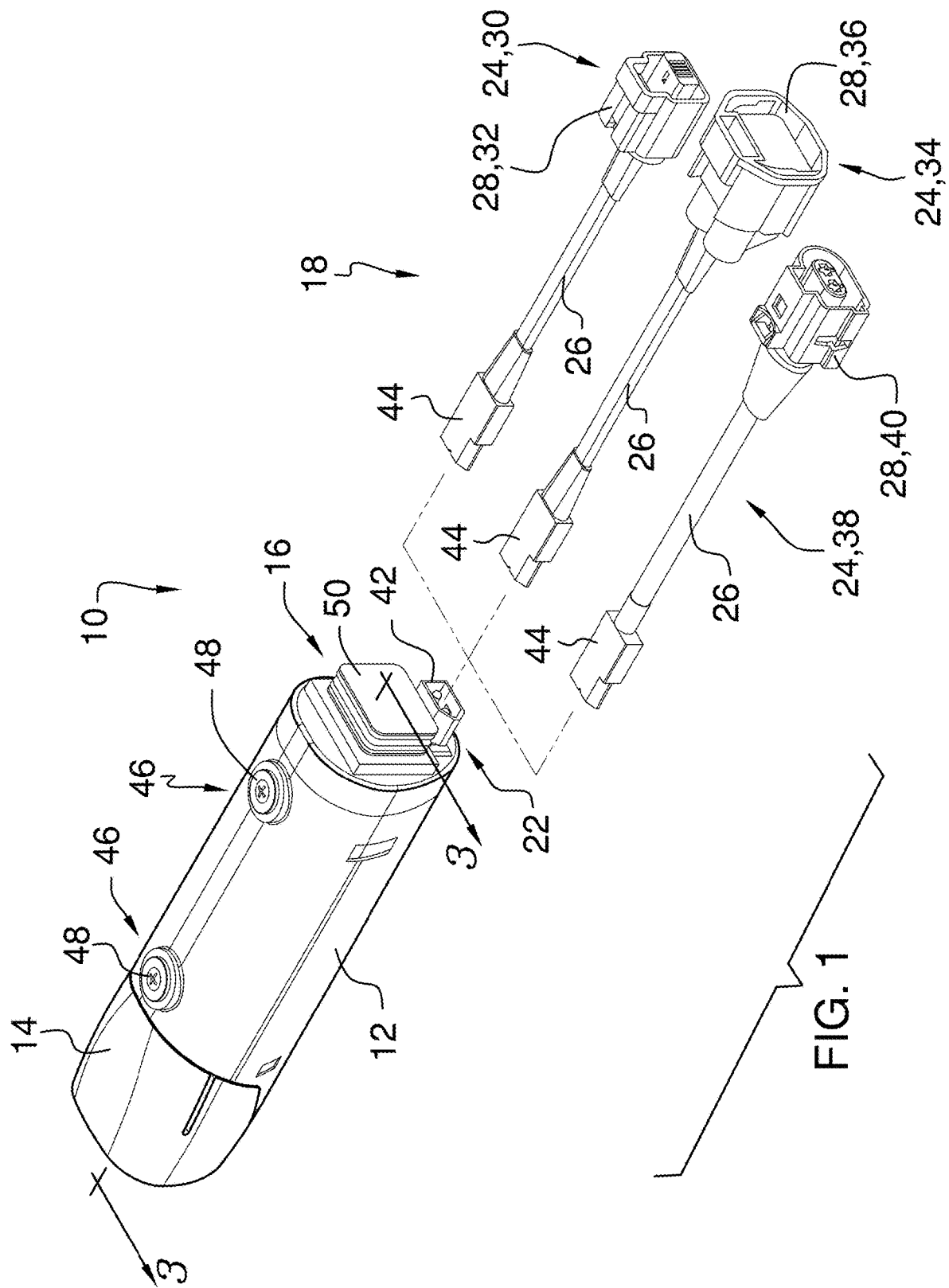
FIG. 1 is a perspective view of a portable electronic brake tool according to an embodiment of the disclosure.
Figure 2:
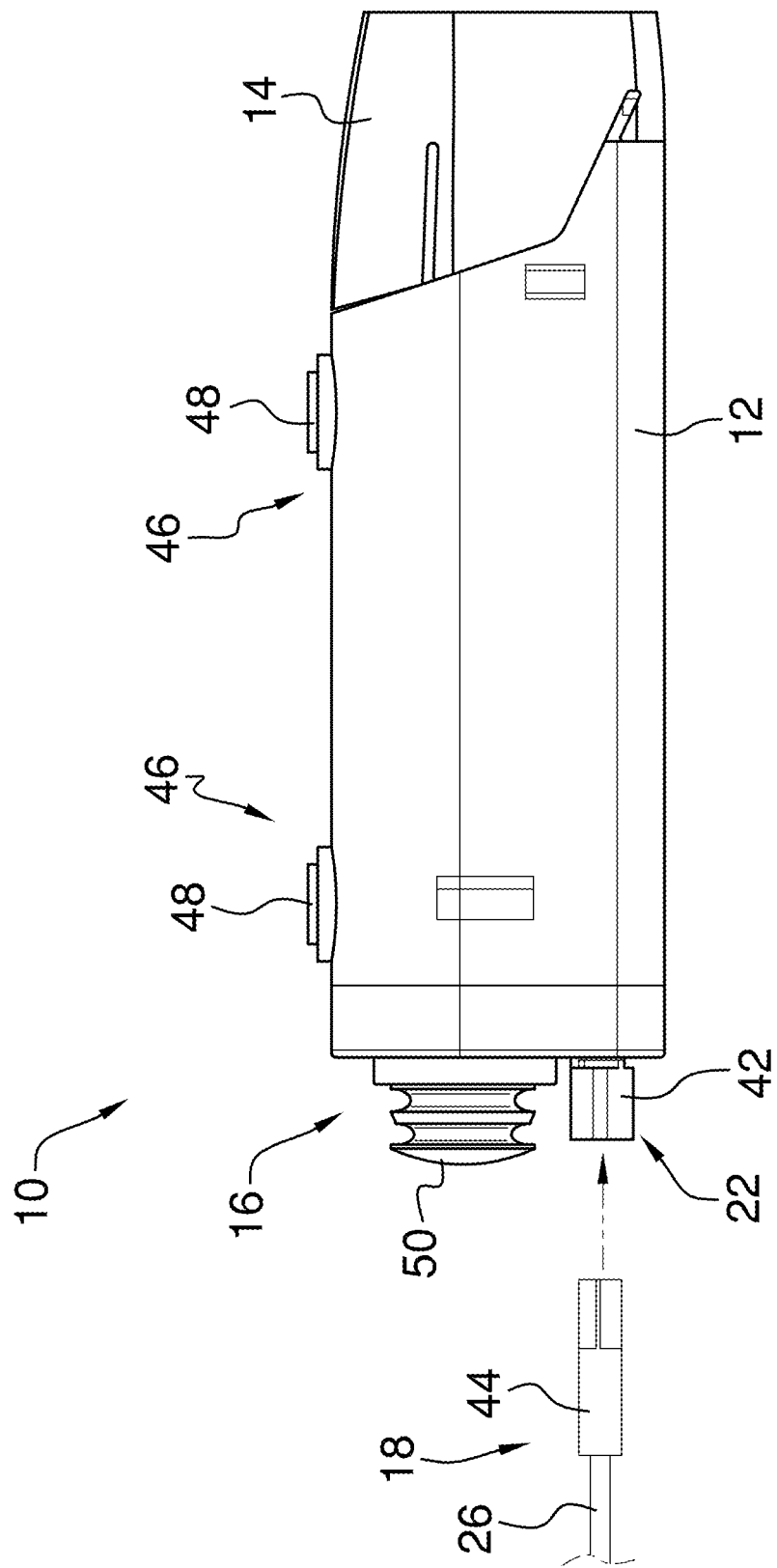
FIG. 2 is a side view of an embodiment of the disclosure.

With reference now to the drawings, and in particular to FIGS. 1 through 7 thereof, a new portable electronic brake tool embodying the principles and concepts of an embodiment of the disclosure and generally designated by the reference numeral 10 will be described.

As best illustrated in FIGS. 1 through 7, the portable electronic brake tool 10 generally comprises a housing 12, a rechargeable battery 14, a reverse polarity switch 16, a connector assembly 18, and an electrical wiring assembly 20. The rechargeable battery 14 is removably inserted into the housing 12. The reverse polarity switch 16 is positioned at an exterior surface of the housing 12. The connector assembly 18 includes a wiring interface 22 mounted in the housing 12 and a wiring harness 24 designed to detachably connect to an electric receptacle of an electronic brake caliper. The electrical wiring assembly 20 is positioned in the housing 12 and operatively connects the rechargeable battery 14, the reverse polarity switch 16, and the wiring interface 22.

Figure 5:
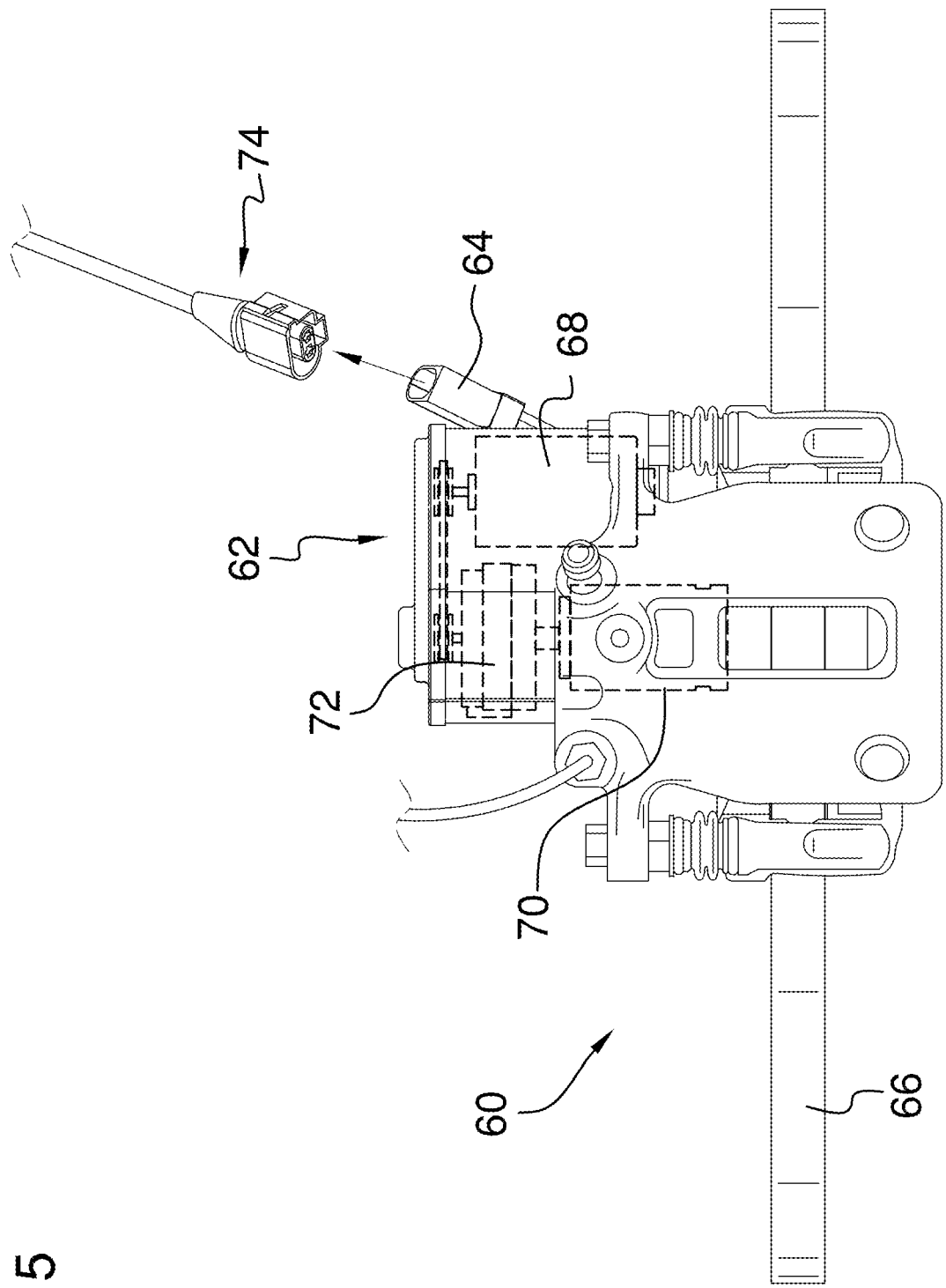
FIG. 5 is a top view of vehicle brake assembly.

As will be discussed in further detail below, the portable electronic brake tool 10 is used when servicing a brake assembly of a vehicle, such as an automobile, that has an electronic brake. An example of such a brake assembly 60 is shown in FIG. 5, which brake assembly 60 includes a rotor 66 and an electronic brake caliper 62. The electronic brake caliper 62 includes an electric receptacle 64, a drive motor 68, a piston 70, and a drive assembly 72 to operatively connect the drive motor 68 and the piston 70.

As shown in FIG. 1, the wiring harness 24 includes a cord 26 and a plug 28. FIG. 1 shows a first exemplary embodiment of the portable electronic brake tool 10, wherein the connector assembly 18 includes a plurality of the wiring harnesses 24. Each of the wiring harnesses 24 includes a different type of the plug 28 designed to detachably connect to a different type of electric receptacle 64 corresponding to an electronic brake caliper 62 of different vehicles or groups of vehicles. To further explain, vehicles do not all utilize the same types of electric receptacles 64 for the electronic brake caliper 62. Some different models of vehicles utilize the same type of electric receptacle 64, but there is no universal electric receptacle 64 common to all models of vehicles. Accordingly, the exemplary embodiment of the portable electronic brake tool 10 shown in FIG. 1 includes three different types of wiring harnesses 24 having three different types of plugs 28, each of which corresponds to a particular type of electric receptacle 64. In the exemplary embodiment shown, a first wiring harness 30 has a first plug 32 that corresponds to a first electric receptacle common to a first group of vehicles, a second wiring harness 34 has a second plug 36 that corresponds to a second electric receptacle common to a second group of vehicles, and a third wiring harness 38 has a third plug 40 that corresponds to a third electric receptacle common to a third group of vehicles. Currently, three types of electric receptacles are used on approximately 90% of vehicles in the United States, so three corresponding plugs 32, 36, 40 are suitable for the exemplary embodiment, though more types of plugs 28 and wiring harnesses 24 could be utilized for vehicles using different electric receptacles in another possible embodiment.

Figure 3:
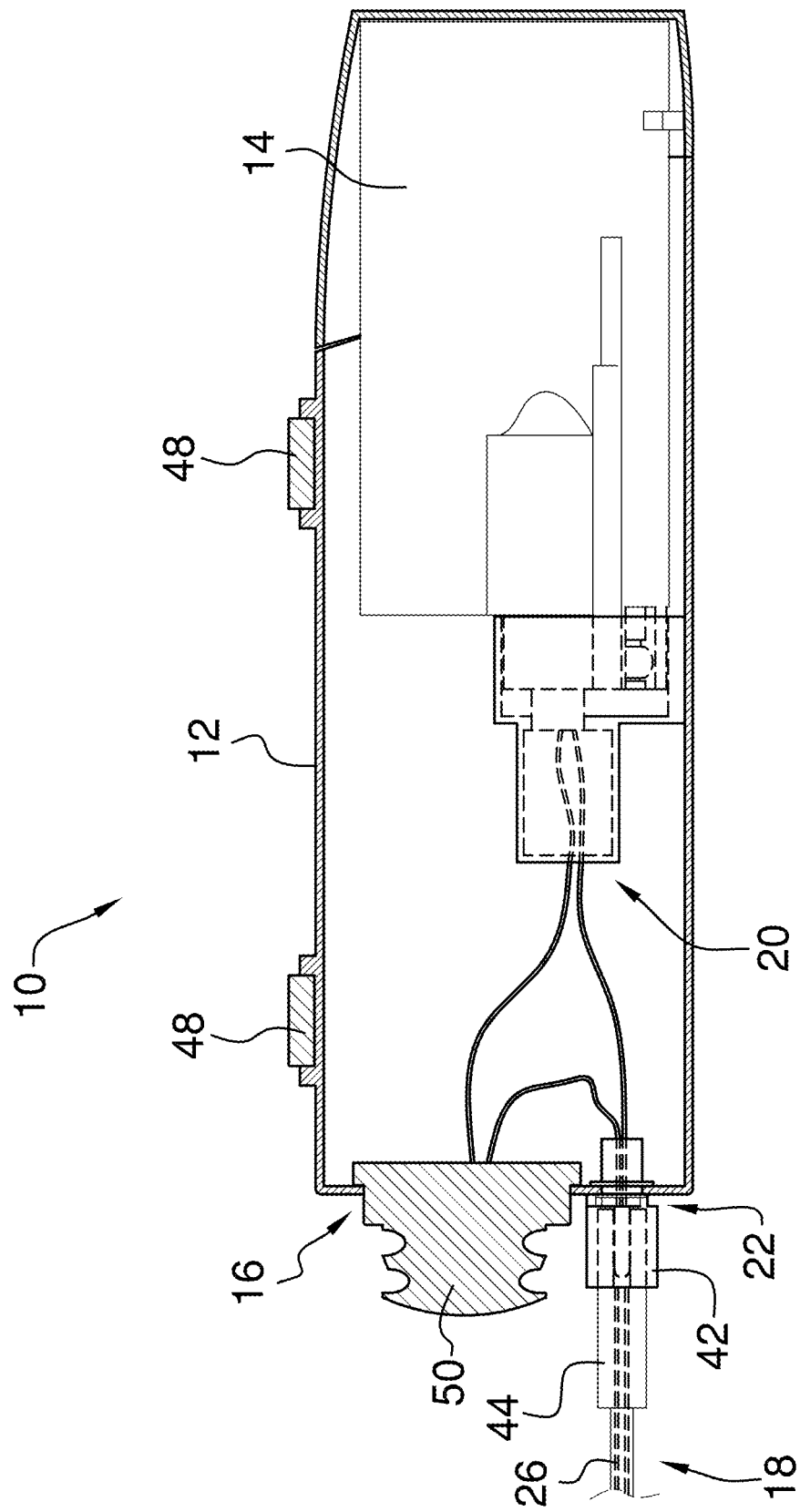
FIG. 3 is a cross-sectional view of an embodiment of the disclosure.

In order to render the wiring harnesses 24 interchangeable, the wiring interface 22 includes a first connecting member 42 projecting from the housing 12 and each of the wiring harnesses 24 includes a second connecting member 44 positioned at an end of the cord 26 opposite the plug 28 and designed to detachably connect with the first connecting member 42. The first connecting member 42 and the second connecting member 44 allow a user to easily switch from one wiring harness 24 to another for different types of vehicles. FIG. 3 shows a cross-sectional view, wherein the rechargeable battery 14 is connected by the electrical wiring assembly 20 to the reverse polarity switch 16 and the wiring interface 22, which includes the first connecting member 42. The second connecting member 44 is inserted into the first connecting member 42 in the exemplary embodiment. Other connections well known in the electrical arts are within the scope of the disclosure.

Figure 4:
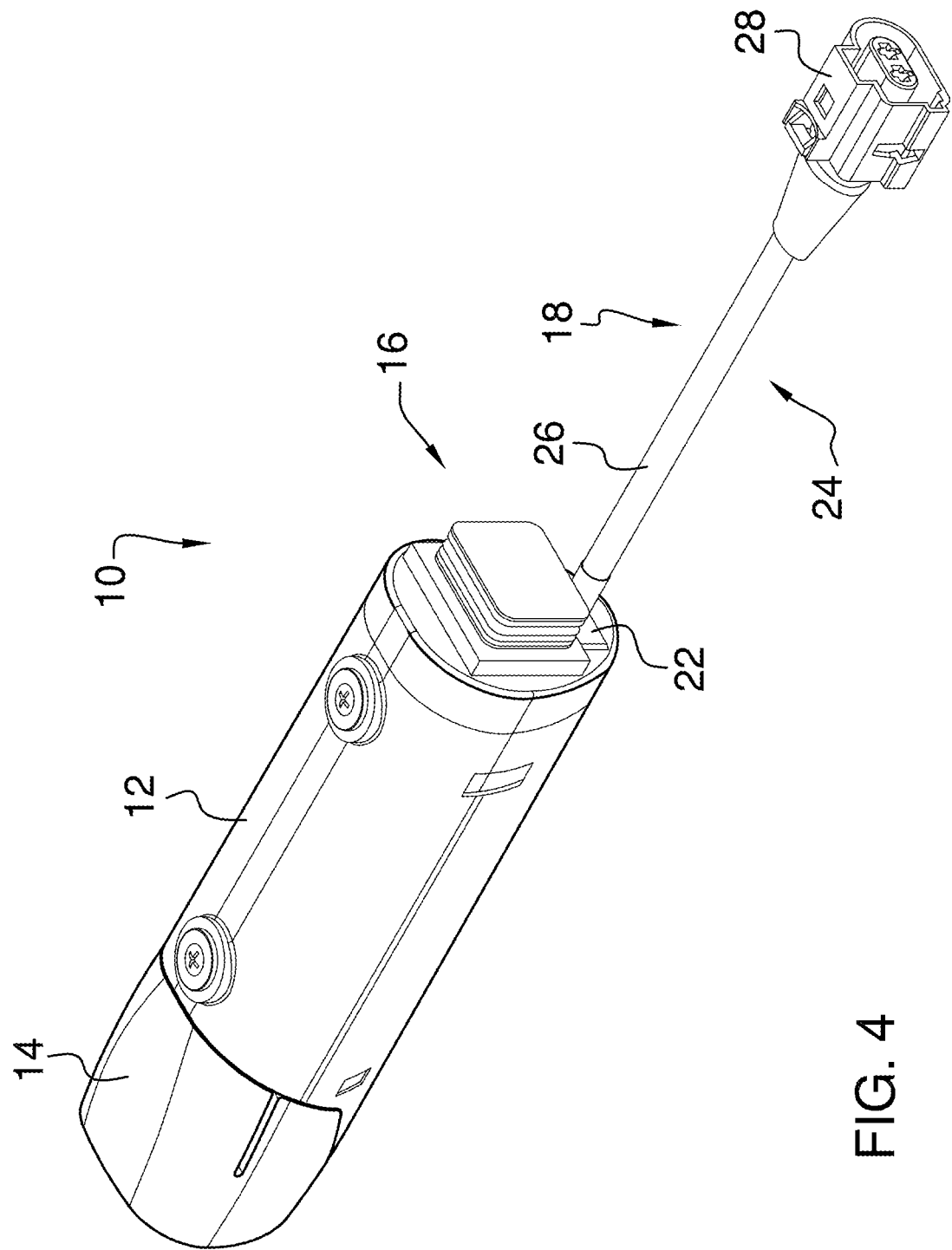
FIG. 4 is a perspective view of an alternative embodiment of the disclosure.

Alternatively, as shown in FIG. 4, the wiring interface 22 could be a hard-wired connection with the cord 26 of the wiring harness 24. Such a design would only allow for servicing of vehicles using one type of electric receptacle 64, which may be suitable for home use or for service technicians that specialize in one type of vehicle or a limited number of types of vehicles that utilize the same type of electrical receptacle.

As shown in the exemplary embodiment in FIG. 1, the housing 12 can include a magnetic mounting structure 46 designed to removably mount the housing 12 on a metallic component of a vehicle adjacent an electronic brake caliper 62, which metallic component could be the rotor 66 of the brake assembly 60. The exemplary embodiment shows that the magnetic mounting structure 46 includes two magnets 48 positioned a distance apart and on one side of the housing 12. However, other designs and positioning of the magnets 48 are within the scope of the disclosure. The housing 12 itself has an elongated shape and is sufficiently small to be held by one hand of a user, such that the portable electronic brake tool 10 is essentially a handheld tool that is easily transported.

In one possible embodiment, the rechargeable battery 14 is a 12-volt battery, as most vehicles operate using a 12-volt battery. One example of such a battery is the M12 line of batteries manufactured by Milwaukee Tool, 13135 West Lisbon Road, Brookfield, WI 53005. The reverse polarity switch 16 includes a waterproof cover 50 mounted at an exterior surface of the housing 12. The reverse polarity switch 16 can be manually engaged to selectively advance or retract the piston 70 of the electronic brake caliper 62. As shown in the exemplary embodiment, the rechargeable battery 14 and the reverse polarity switch 16 are positioned at opposite ends of the housing 12, though other positions are within the scope of the disclosure.

Figure 6:
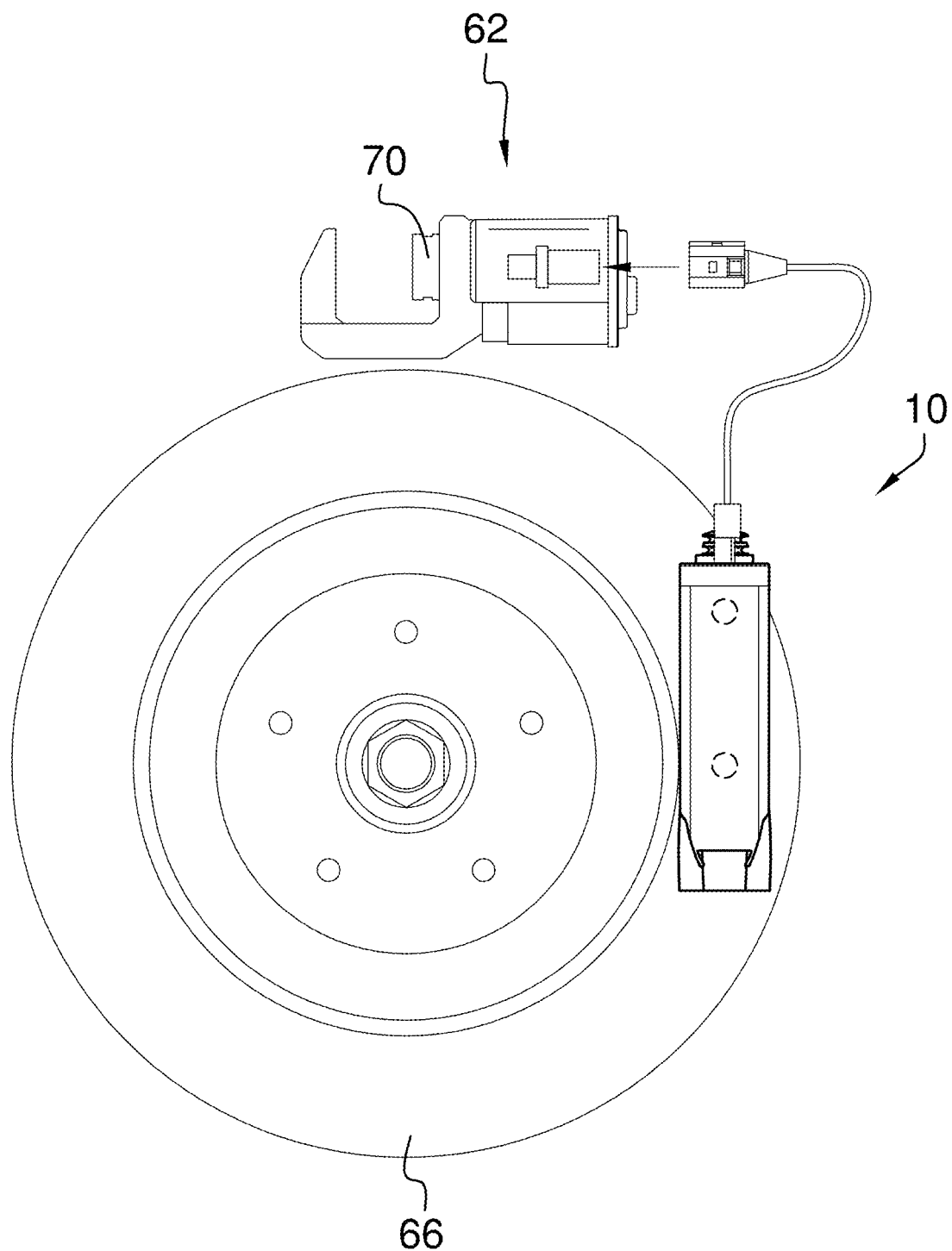
FIG. 6 is a side view of an embodiment of the disclosure in use.
Figure 7:
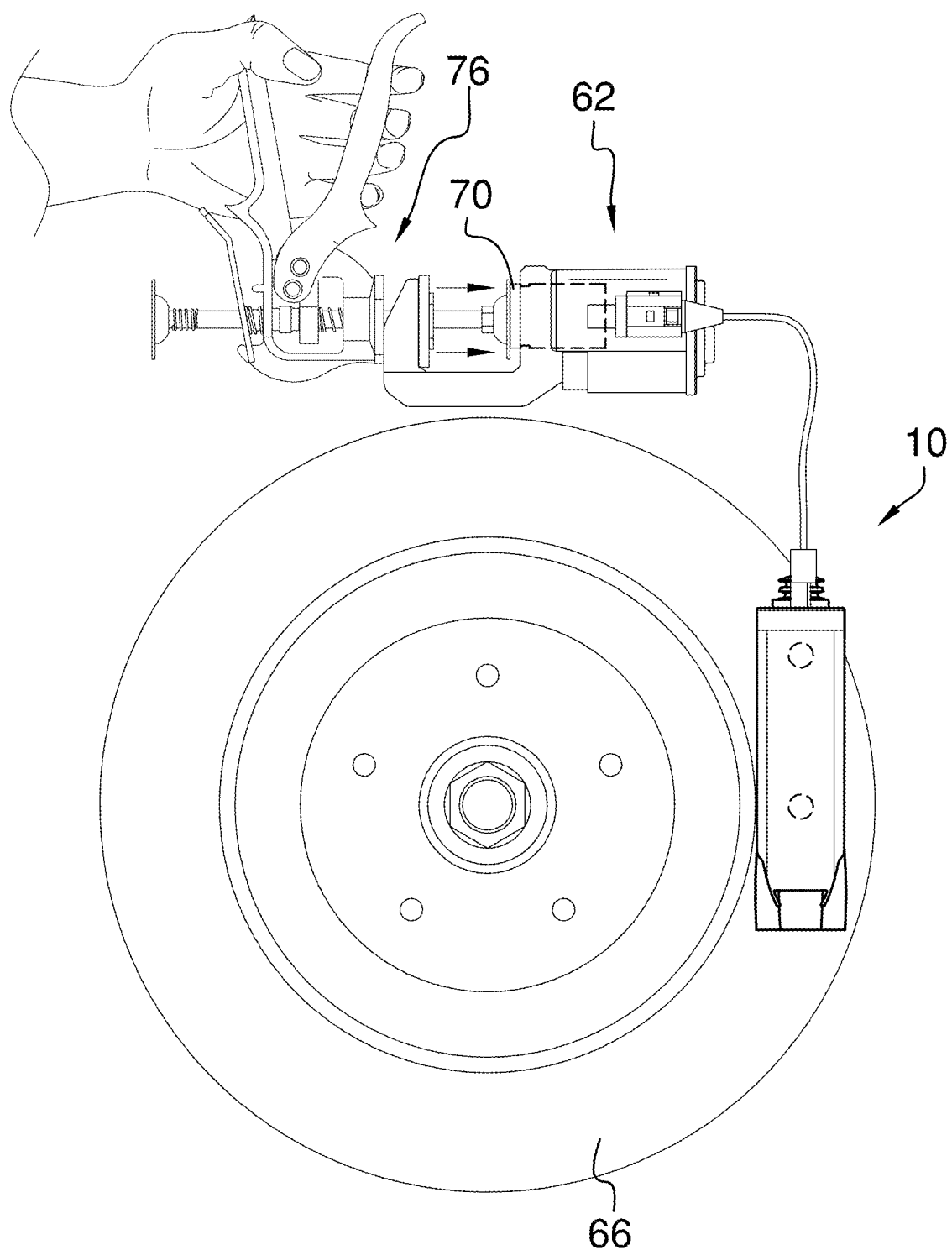
FIG. 7 is a side view of an embodiment of the disclosure in use.

When servicing the brake assembly 60 using the portable electronic brake tool 10, the user first disconnects the electric receptacle 64 from an electrical assembly 74 of a vehicle, as shown in FIG. 5. Then, as shown in FIG. 6, the user can connect the portable electronic brake tool 10 by connecting the wiring harness 24 of the connector assembly 18 to the electric receptacle 64 of the electronic brake caliper 62. FIG. 6 shows that this connection can be performed while the electronic brake caliper 62 is disconnected from the brake rotor 66 but could also be performed while the electronic brake caliper 62 is mounted on the brake rotor 66 as shown in FIG. 5. At any time, the user can engage the reverse polarity switch 16 to selectively advance or retract the piston 70 of the electronic brake caliper 62. As shown in FIG. 7, for complete retraction of the piston 70, the user usually has to provide supplemental pressing force on the piston 70, such as by using a spreader tool 76 as shown or by manually pressing on the piston 70. As mentioned above, the magnetic mounting structure 46 can removably mount the housing 12 on a metallic component, in this case the rotor 66, which frees up the hands of the user.

In addition, as mentioned above, the user can service multiple vehicles with the interchangeable wiring harnesses 24 shown in FIG. 1. For example, the user can select the first wiring harness 30 and detachably connect the first wiring harness 30 to the wiring interface 22. The user then uses the portable electronic brake tool 10 with an electronic brake caliper 62 having a first type of electric receptacle 64 corresponding to the first plug 32. The user can then disconnect the first wiring harness 30 and select the second wiring harness 34, or the third wiring harness 38 as the case may be, and detachably connect the second wiring harness 34 to the wiring interface 22. The user then uses the portable electronic brake tool 10 with another electronic brake caliper 62 having a second type of electric receptacle 64 corresponding to the second plug 36.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

We claim:

1. A portable electronic brake tool comprising:
   a housing;
   a rechargeable battery removably inserted into said housing;
   a reverse polarity switch disposed at an exterior surface of said housing;
   a connector assembly comprising a wiring interface mounted in said housing and a wiring harness configured to detachably connect to an electric receptacle of an electronic brake caliper; and
   an electrical wiring assembly disposed in said housing and operatively connecting said rechargeable battery, said reverse polarity switch, and said wiring interface.

2. The portable electronic brake tool of claim 1, wherein said wiring harness comprises a cord and a plug.

3. The portable electronic brake tool of claim 2, wherein said connector assembly comprises a plurality of said wiring harnesses each comprising a different type of said plug configured to detachably connect to a different type of electric receptacle corresponding to an electronic brake caliper of different automobiles or groups of automobiles, wherein said wiring interface comprises a first connecting member projecting from said housing and each of said wiring harnesses comprises a second connecting member disposed at an end of said cord opposite said plug and configured to detachably connect with said first connecting member.

4. The portable electronic brake tool of claim 1, wherein said housing comprises a magnetic mounting structure configured to removably mount said housing on a metallic component of an automobile adjacent an electronic brake caliper.

5. The portable electronic brake tool of claim 4, wherein said magnetic mounting structure comprises two magnets disposed a distance apart and on one side of said housing.

6. The portable electronic brake tool of claim 1, wherein said housing has an elongated shape and is sufficiently small to be held by one hand of a user.

7. The portable electronic brake tool of claim 1, wherein said rechargeable battery comprises a 12-volt battery.

8. The portable electronic brake tool of claim 1, wherein said reverse polarity switch comprises a waterproof cover mounted at an exterior surface of said housing.

9. A method of using a portable electronic brake tool comprising a housing; a rechargeable battery removably inserted into said housing; a reverse polarity switch disposed at an exterior surface of said housing; a connector assembly comprising a wiring interface mounted in said housing and a wiring harness configured to detachably connect to an electric receptacle of an electronic brake caliper; and an electrical wiring assembly disposed in said housing and operatively connecting said rechargeable battery, said reverse polarity switch, and said wiring interface; said method comprising the steps of:
   disconnecting an electric receptacle of an electronic brake caliper from an electrical assembly of an automobile;
   connecting the portable electronic brake tool by connecting said wiring harness of said connector assembly to the electric receptacle of the electronic brake caliper; and
   engaging said reverse polarity switch to selectively advance or retract the piston of the electronic brake caliper.

10. The method of claim 9, wherein said wiring harness comprises a cord and a plug, and wherein said connector assembly comprises a plurality of said wiring harnesses each comprising a different type of said plug configured to detachably connect to a different type of electric receptacle corresponding to an electronic brake caliper of different automobiles or groups of automobiles, and wherein said wiring interface comprises a first connecting member projecting from said housing and each of said wiring harnesses comprises a second connecting member disposed at an end of said cord opposite said plug and configured to detachably connect with said first connecting member, and wherein said method further comprises:
   selecting a first wiring harness comprising a first type of said plug and detachably connecting said first wiring harness to said wiring interface;
   using the portable electronic brake tool with an electronic brake caliper having a first type of electric receptacle corresponding to said first type of said plug;
   disconnecting said first wiring harness and selecting a second wiring harness comprising a second type of said plug and detachably connecting said second wiring harness to said wiring interface; and using the portable electronic brake tool with another electronic brake caliper having a second type of electric receptacle corresponding to said second type of said plug.

11. The method of claim 9, wherein said housing comprises a magnetic mounting structure, and wherein said method further comprises magnetically removably mounting said housing on a metallic component of an automobile adjacent an electronic brake caliper.

12. The method of claim 11, wherein said step of magnetically removably mounting said housing comprises magnetically removably mounting said housing on a surface of a rotor of an automobile brake.

13. A portable electronic brake tool comprising:
a housing, wherein:
   said housing comprises a magnetic mounting structure configured to removably mount said housing on a metallic component of an automobile adjacent an electronic brake caliper, wherein said magnetic mounting structure comprises two magnets disposed a distance apart and on one side of said housing,
   said housing has an elongated shape and is sufficiently small to be held by one hand of a user;
a rechargeable battery removably inserted into said housing, wherein said rechargeable battery comprises a 12-volt battery;
a reverse polarity switch disposed at an exterior surface of said housing, wherein said reverse polarity switch comprises a waterproof cover mounted at an exterior surface of said housing;
a connector assembly comprising a wiring interface mounted in said housing and a wiring harness configured to detachably connect to an electric receptacle of an electronic brake caliper, wherein said wiring harness comprises a cord and a plug; and
an electrical wiring assembly disposed in said housing and operatively connecting said rechargeable battery, said reverse polarity switch, and said wiring interface.

14. The portable electronic brake tool of claim 13, wherein said connector assembly comprises a plurality of said wiring harnesses each comprising a different type of said plug configured to detachably connect to a different type of electric receptacle corresponding to an electronic brake caliper of different automobiles or groups of automobiles, wherein said wiring interface comprises a first connecting member projecting from said housing and each of said wiring harnesses comprises a second connecting member disposed at an end of said cord opposite said plug and configured to detachably connect with said first connecting member.

* * * * *